United States Patent [19]

Tanji et al.

[11] Patent Number: 4,551,695
[45] Date of Patent: Nov. 5, 1985

[54] SURFACE ACOUSTIC DEVICE HAVING MULTISTRIP COUPLER COMPRISED OF ALTERNATE COUPLED AND UNCOUPLED STRIPS

[75] Inventors: Shigeo Tanji, Yokohama; Noboru Wakatsuki, Kawasaki, both of Japan

[73] Assignee: Fujitsu Limited, Kawasaki, Japan

[21] Appl. No.: 508,546

[22] Filed: Jun. 28, 1983

[30] Foreign Application Priority Data

Jun. 29, 1982 [JP] Japan .................................. 57-111888

[51] Int. Cl.⁴ ............................................. H03H 9/25
[52] U.S. Cl. .................................... 333/195; 333/153; 310/313 D
[58] Field of Search ............... 333/193, 195, 196, 194, 333/150, 151, 152, 153, 154; 310/313 R, 313 B, 313 C, 313 D

[56] References Cited

U.S. PATENT DOCUMENTS 3,987,379 10/1976 De Vries .............................. 333/195
3,988,703 10/1976 De Vries .............................. 333/195
4,355,290 10/1982 Bagdasarian ......................... 333/195

Primary Examiner—Eugene R. LaRoche
Assistant Examiner—Benny T. Lee
Attorney, Agent, or Firm—Staas & Halsey

[57] ABSTRACT

A surface acoustic wave device comprising a first set of interdigital electrodes that generate surface acoustic waves, a second set of interdigital electrodes that receive and convert surface acoustic waves into electrical signals, and an intermediate electromechanical coupling element provided therebetween. The coupling element comprises a plurality of parallel strips formed on the surface of a piezoelectric substrate such as to receive and change the direction of propagation of the surface acoustic waves, each of these parallel strips being spaced at a predetermined distance from each other and connected therebetween in a given manner to obtain suitable stopband characteristics.

7 Claims, 18 Drawing Figures

SURFACE ACOUSTIC DEVICE HAVING MULTISTRIP COUPLER COMPRISED OF ALTERNATE COUPLED AND UNCOUPLED STRIPS

BACKGROUND OF THE INVENTION (1) Field of the Invention

The present invention relates to a surface acoustic wave (SAW) device comprising an input-side transducer, an output-side transducer, and an electromechanical coupling means provided therebetween so as to change the propagation path of the surface acoustic wave. More particularly, it relates to a SAW device wherein the electromechanical coupling means is formed in a given shape to obtain the desired stopband characteristics.

SAW devices in accordance with the present invention can be used as filtering devices, signal delaying devices, or the like.

(2) Description of the Prior Art

Surface acoustic wave (SAW) devices comprising electromechanical coupling means elements are called multistrip lines (or couplers) which consist of a plurality of electrically conductive strips provided between an input-side transducer and an output-side transducer. These devices, which apply the essential surface acoustic waves of the acoustic waves emitted from the input-side transducer to the output-side transducer and prevent the bulk waves from being applied to the output-side transducer (e.g., U.S. Pat. No. 3,739,290 and U.S. Pat. No. 3,836,876), are already known.

FIG. 1 is a plan view of an example of a prior art SAW device. In FIG. 1, a SAW device 1 comprises a piezoelectric substrate 11 consisting, for example, of lithium niobium oxide (LiNbO$_3$), an input transducer 16 formed on the surface of the substrate 11, an output transducer 18 formed on the surface of the substrate 11, and the coupler 20 provided between the input transducer 16 and the output transducer 18. The input transducer 16 comprises interdigital electrodes 12 and 14, as shown in FIG. 1. The output transducer 18 is formed in a manner similar to the input transducer 16.

When a high-frequency AC power source is applied to the electrodes 12 and 14 of the input transducer 16, surface acoustic waves W are generated in the surface region of the piezoelectric substrate 11 and propagate in the direction shown in FIG. 1 (the surface acoustic waves propagating in the opposite direction are not shown). The surface acoustic waves W may include essential surface acoustic waves as well as bulk waves, which may exert an adverse influence on device performance such as its filtering characteristics. It is preferable that the bulk waves not be applied to the output transducer 18. The coupler 20 is provided so that only the essential wave component is received. An electric potential is induced at the coupler 20 in response to the received wave. This potential generates surface acoustic waves W', which are applied to the output transducer 18. The coupler 20 includes a plurality of conductive strips 22 formed on the surface of the substrate 11 and parallel to each other, each of which induces a voltage in response to the waveform signal of the essential component of the surface acoustic waves W. The bulk waves Wb cannot otherwise be caught at the strips 22 and will propagate forward to the output transducer. The voltages induced at the conductive strips 22 are transmitted to the opposite ends of the strips, where the strips are associated with the substrate 11 so as to generate secondary surface acoustic waves W'. The output transducer 18 receives the secondary surface acoustic wave W' and outputs an electrical signal in response to the received wave W'. As mentioned above, the direction of propagation is changed by the coupler 20 as shown and only the essential surface component of the wave is applied to the output transducer 18. This gives the required characteristics, such as a signal delaying feature, between the input transducer 16 and the output transducer 18.

The coupler 20 mentioned above has a considerably wide frequency bandwidth. Therefore, prior art SAW devices have such drawbacks as an inability to obtain given filtering characteristics. This is the case, for example, with filters used in television sets, which have a deep trap level at both ends of the passband.

SUMMARY OF THE INVENTION

An object of the present invention is to provide a surface acoustic wave device that maintains the ability to avoid the influence of the bulk wave and transmit only the essential surface wave, and that provides given filtering characteristics using relatively simple technology.

According to the present invention, there is provided a surface acoustic wave device including a piezoelectric substrate, and a first electrode means having a set of interdigital electrodes formed on the surface of the substrate for generating surface acoustic waves on the surface region of the substrate when a high-frequency AC voltage is applied between the set of interdigital electrodes. A second electrode means having a set of interdigital electrodes is also formed on the surface of the substrate, the center of the second electrode means being spaced at a distance from the center of the first electrode means in the direction of propagation of the surface acoustic waves and generating an electrical signal between the interdigital electrodes in response to the received surface acoustic waves. An electromechanical coupling means having a plurality of electrically conductive strips is formed on the substrate between the first electrode means and the second electrode means and oriented perpendicular to the direction of propagation of the surface acoustic waves, each of the conductive strips being arranged in parallel at a given distance from each other and connected to each other in a given manner at a given position in the longitudinal direction thereof.

Other objects and features of the present invention will be described in detail with reference to the accompanying drawings.

DESCRIPTION OF THE PREFERRED EMBODIMENTS

Figure 2:
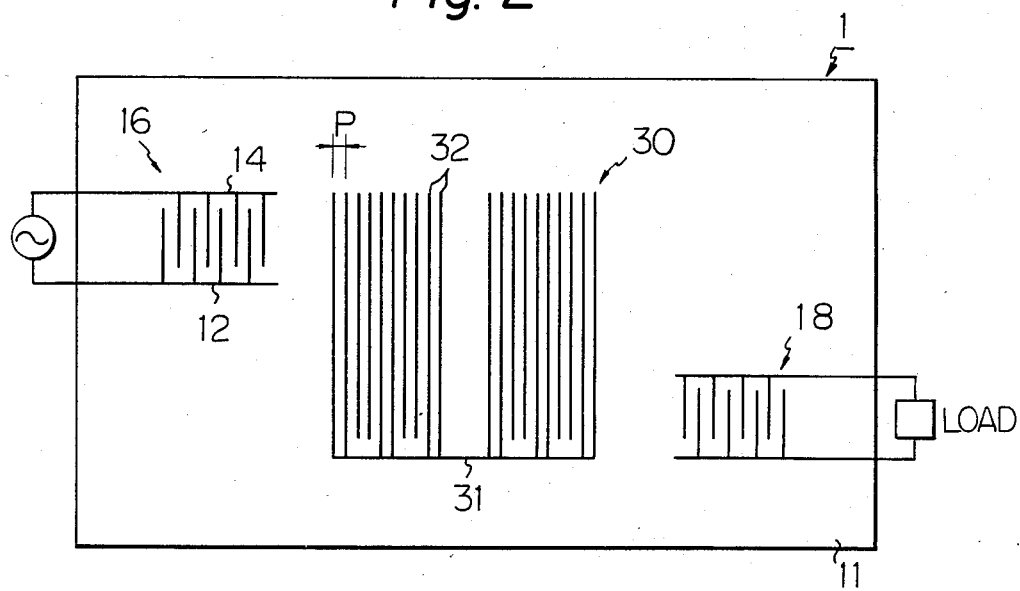
FIG. 2 is a plan view of an embodiment of a SAW device in accordance with an embodiment of the present invention.

An example of the present invention is shown in FIG. 2. Here, a surface acoustic wave (SAW) device 1 comprises a piezoelectric substrate 11 consisting of, for example, lithium niobium oxide (LiNbO$_3$) on which is provided a first set of electrodes 16 serving as an input transducer, a second set of electrode 18 serving as an output transducer, and an electromechanical coupling element 30. The electromechanical coupling element 30 comprises a plurality of strips 32 arranged in parallel with each other in a repeating pattern and adjacent to the second electrode means 18 in which two consecutive strips are connected at first ends thereof and the following two consecutive strips are not connected at the first ends thereof. The two consecutive unconnected strips are not electrically grounded and isolated. A common connecting strip 31 is normally grounded, but may be not grounded. The strips 32 and the common connecting strip 31 may be formed by, for example, a vapor deposition process using a conductive material such as aluminum (Al). The two sets of electrodes 16 and 18 may also be formed in this way.

There are provided a plurality of parallel strips 32, the exact number of which depends on the desired reception performance of the surface acoustic waves. In general, many strips are required because each strip only catches the respective surface acoustic waves in accordance with its reception performance, which depends on the wavelength passing through the corresponding strip, and induces an electrical signal. Beyond a certain number of strips, the reception performance tends to decrease. Performance, manufacturing costs, size, and other factors should therefore be taken into account in selecting an optimum number of strips. In this example, the preferred strip number is approximately 100 to 200, as mentioned later.

When n stopbands are required, the center-to-center distance p between the longitudinal strips is defined as follows:

$$p \approx (\tfrac{1}{2}n \cdot V / 4 f_T) \qquad (1)$$

where,

V: propagation speed of the surface acoustic wave; and $f_T$: center frequency at the required stop band.

Figure 3A:
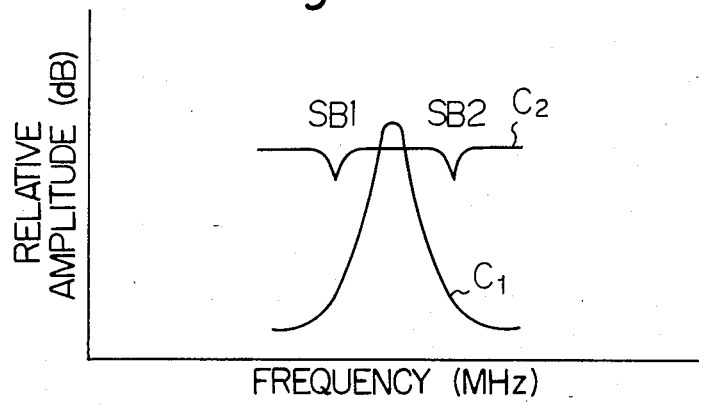
FIGS. 3A and 3B are waveform diagrams of the principal gain attenuation characteristic of a SAW device in accordance with the embodiment of the present invention of FIG. 2.
Figure 3B:
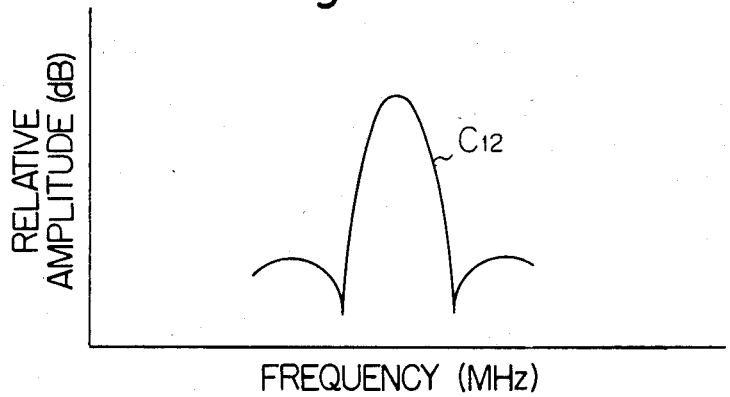

When the pitch p between the strips is defined on the basis of the above relationship, the desired electromechanical coupling element can be formed, this having, for example, one stopband (n=1) or two stopbands (n=2). When n=2, a principal characteristic of stopbands SB1, SB2 is shown in FIG. 3A as curve C2. On the other hand, the first set of electrodes 16 and the second set of electrodes 18 have essentially the attenuation characteristic as curve C1 shown in FIG. 3A. The total performance of the SAW device in FIG. 2 is shown as curve C12 in FIG. 3B, which is the summation of curves C1 and C2.

The measured performances of the example mentioned above with reference to the SAW device in FIG. 2 (type: B-e) are shown in FIGS. 5–9. Measurements were carried out under the following conditions. Substrate: 128°-rotated Y-cut, X-propagating LiNbO$_3$; the interdigital electrodes of the first and second set of electrodes 16 and 18 were formed in a one-to-one correspondence; external impedance of the SAW device was 50 ohms.

Figure 5:
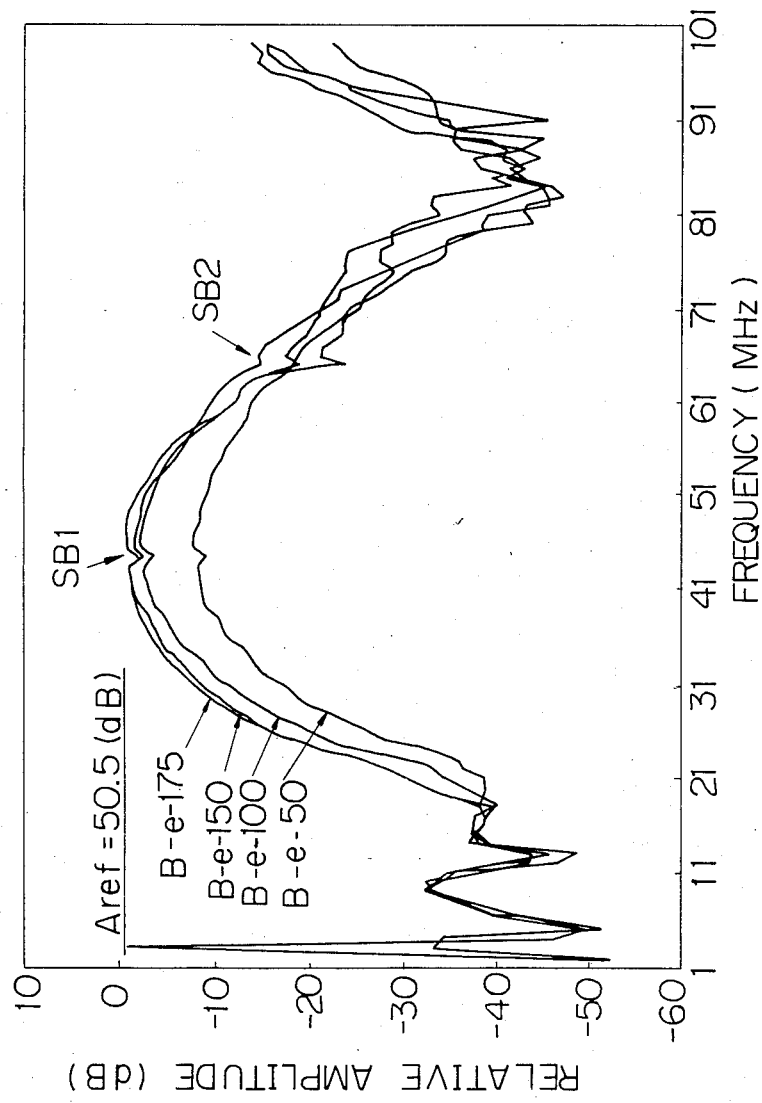
FIG. 5 is a graph of the actual gain attenuation characteristic obtained by the SAW device shown in FIG. 2.

FIG. 5 shows the total frequency-amplitude characteristics of a SAW device (type: B-e). The curves B-e-50, 100, 150 and 175 are plotted for 50, 100, 150, and 175 strips, the respectively. In FIG. 5, attenuation relative to the maximum value, i.e., A ref=50.5 dB, is plotted on the vertical axis and the frequency is plotted on the horizontal axis.

Figure 1:
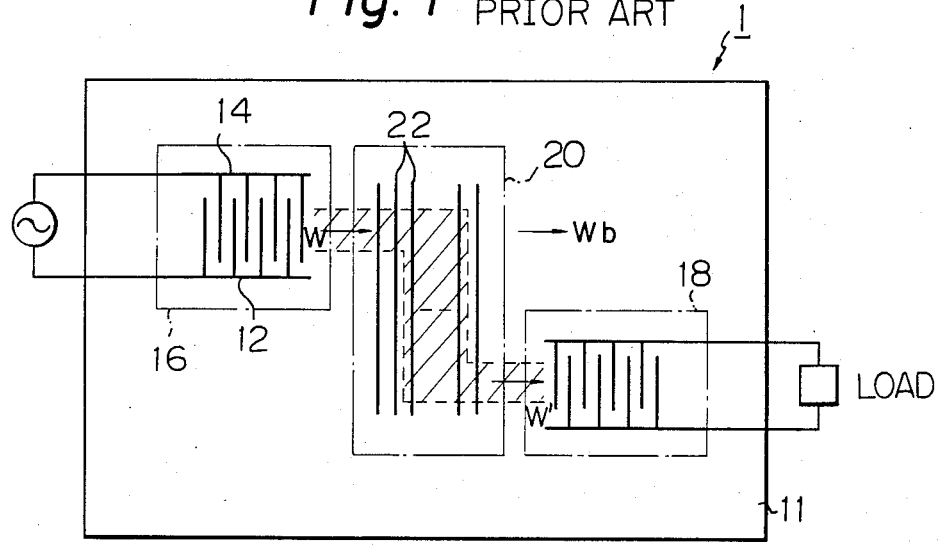
FIG. 1 is a plan view of an example of a prior art surface acoustic wave (SAW) device provided with an electromechanical coupling means.
Figure 4:
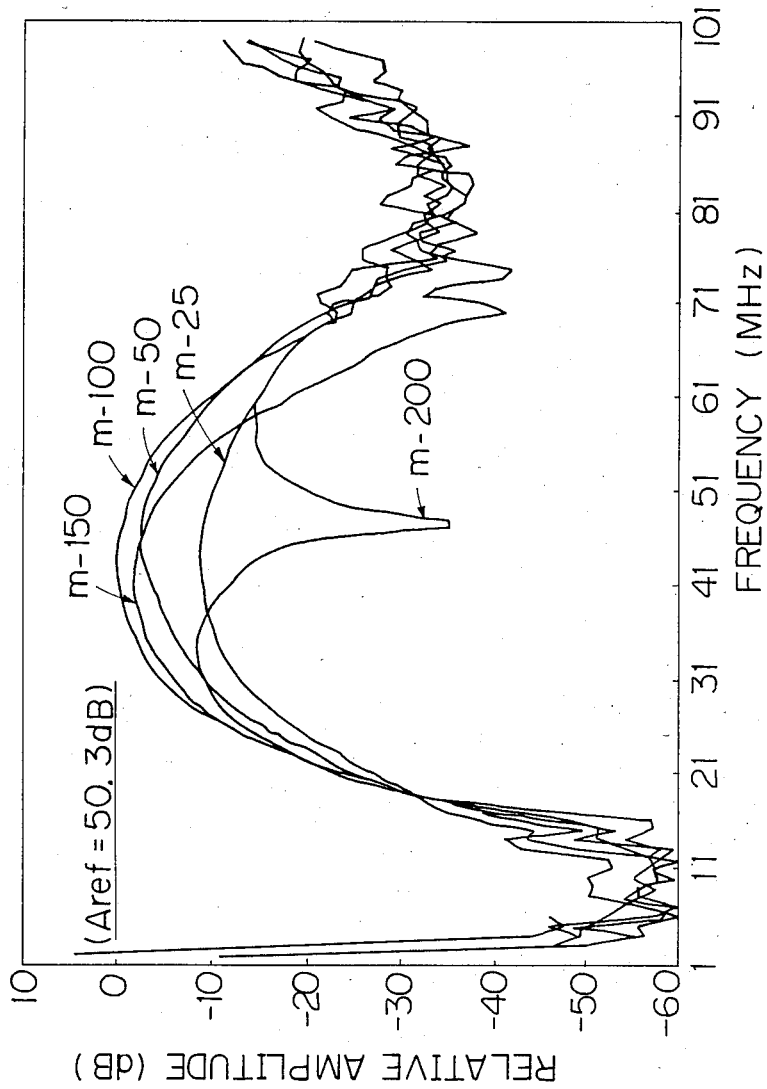
FIG. 4 is a graph of the actual gain attenuation characteristic obtained by the SAW device shown in FIG. 1.

FIG. 4 shows the same characteristics as those in FIG. 5, obtained in the prior art SAW device shown in FIG. 1. The curves m-25, 50, 100, 150 and 200 represent 25, 50, 100, 150 and 200 strips, respectively.

From a comparison of the characteristics shown in the curves in FIGS. 4 and 5, it is apparent that first and second stopbands SB1 and SB2 exist at f≈43 (MHz) and f≈65 (MHz) on the curves in FIG. 5.

Figure 6:
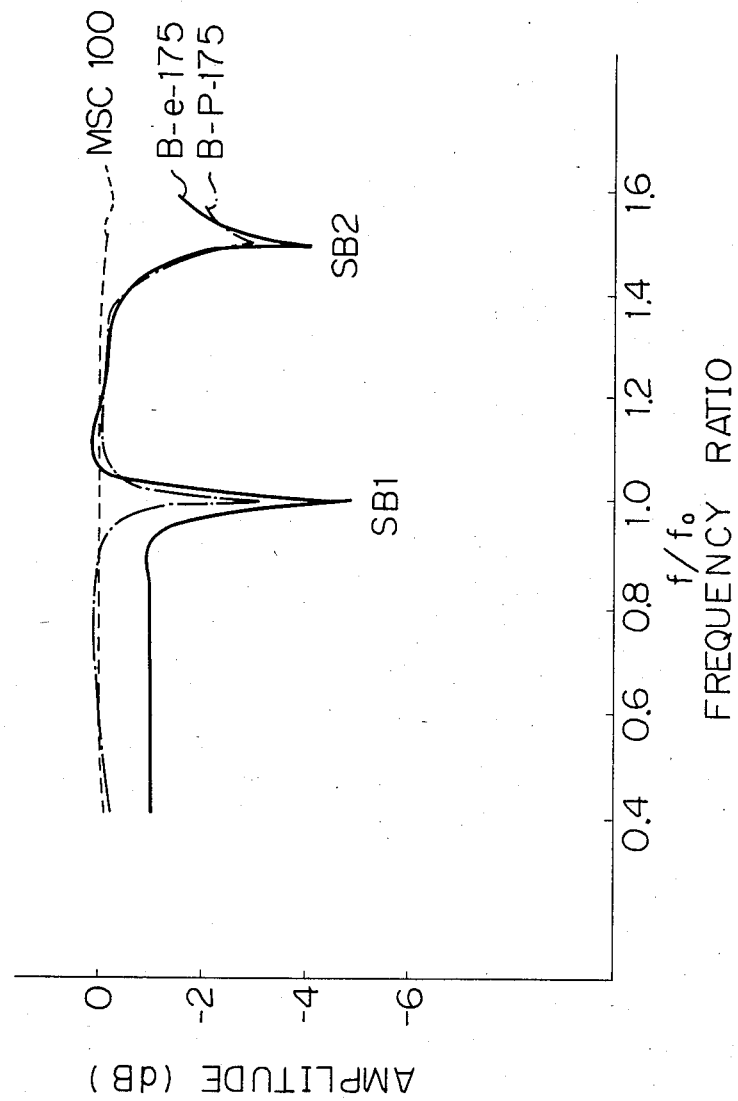
FIG. 6 is a graph of the stopband gained by the electromechanical coupling means of the SAW device in FIG. 2.

In FIG. 3, a general stopband curve in accordance with the present invention is shown as curve C2, while FIG. 6 shows an actual stopband feature given by the electromechanical coupling element as curve B-e 175. Curve B-e 175 has two stopbands, SB1 and SB2. Curve MSC 100, for an electromechanical coupling element having 100 strips, shows the measured results for the coupler in FIG. 1. No stopbands appear here because the coupler has a broad frequency range, i.e., curve MSC 100 is almost flat.

Figure 7:
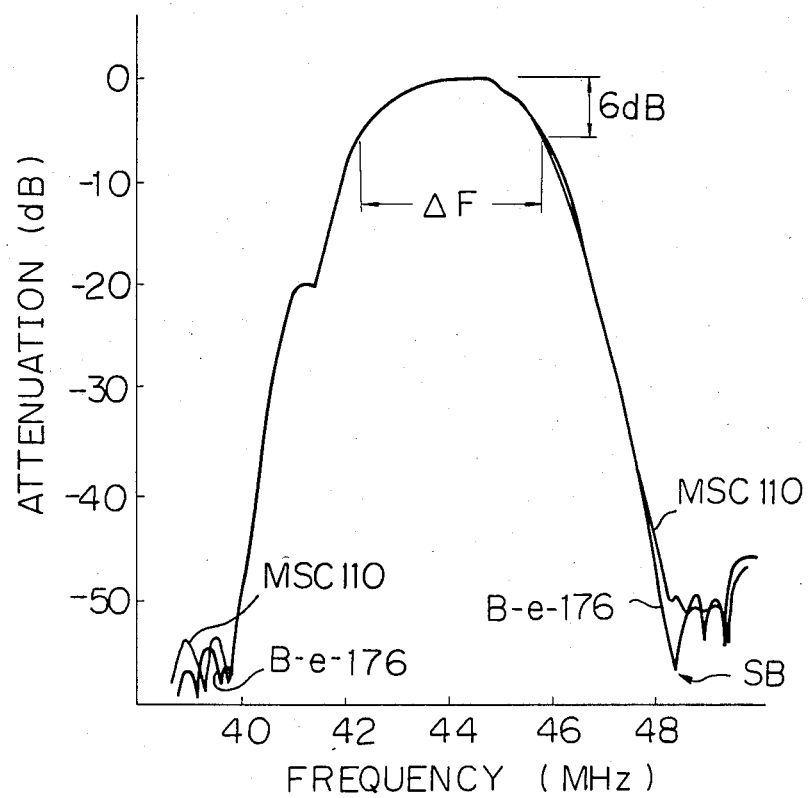
FIG. 7 is a graph of the total filtering characteristic obtained by the SAW device shown in FIG. 2.

Curve B-e 176 in FIG. 7 shows another actual characteristic curve of the SAW device shown in FIG. 2 and corresponds to the characteristic curve shown in FIG. 5. The measurement conditions were as follows: strip pitch p mentioned in Expression (1): 20.3 μm; 176 strips; width of each strip: 2000 Å; electrically conductive material: Aluminum (Al); pitch of the interdigital electrodes in the first and set of second electrodes: 22

μm; substrate: 128°-rotated, Y-cut, X-propagating LiNbO₃. Curve MSC 110 in FIG. 7 represents data obtained from a prior device having a distance between strips of 20.9 μm, and 110 strips. Curves B-e 176 and MSC 110 are the total frequency-attenuation characteristics at a center frequency of 44 MHz and a frequency band width of ±4 MHz.

Curves MSC 110 and B-e 176 in FIG. 7 are similar in shape. However, curve B-e 176 for the device in accordance with the present invention has a distinctive stopband SB at a frequency of 48.5 MHz. This means that curve B-e 176 has an improved rejection performance compared with curve MSC 110, particularly at higher frequencies. The SAW device mentioned above is therefore available for use as a filtering device having a center frequency of 44 MHz and a band width of ±4 MHz.

Figure 8:
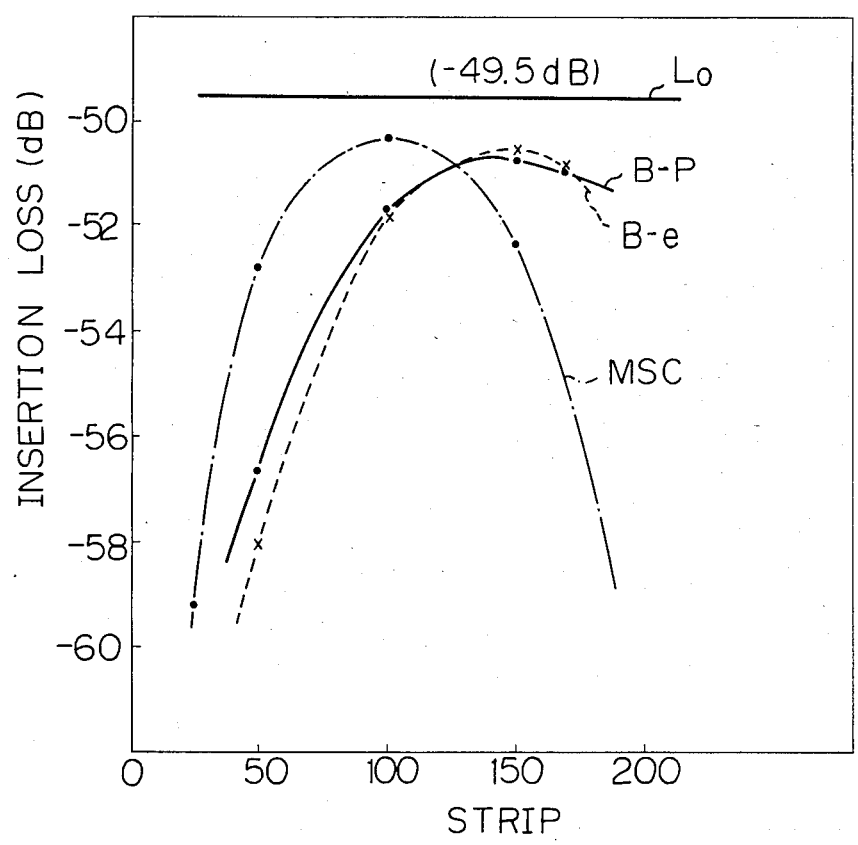
FIG. 8 is a graph of the insertion losses versus the number of the strips in the electromechanical coupling means of the SAW device in FIG. 2.

A greater number of strips are required in the present invention (170) than in prior art devices (110), as shown in FIG. 7. Yet, the SAW device can obtain a similar frequency-attenuation curve at the desired frequency range. The relationship between the number of strips and the insertion loss is shown in FIG. 8. In FIG. 8, curve MSC represents the prior art device, curve B-e the SAW device in accordance with the present invention, and straight line $L_0$ represents a SAW device without an intermediate electromechanical coupling element. Line $L_0$ has a constant loss of −49.5 dB. As seen from FIG. 8, the preferred number of strips in the SAW device shown in FIG. 2 ranges from approximately 100 to 200.

Figure 9:
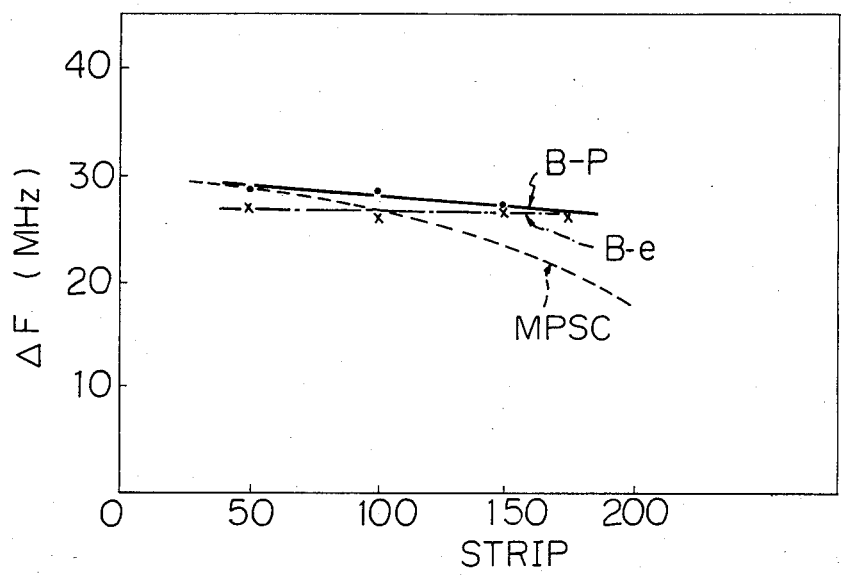
FIG. 9 is a graph of the frequency band versus the number of strips in the SAW device in FIG. 2.

FIG. 9 shows the relationship between the frequency band width ΔF, which has a frequency range of 6 dB down from the maximum value in FIG. 7, and the number of strips. In FIG. 9, curve MPSC represents the prior art device and curve B-e represents the SAW device in accordance with the present invention. It is clear that curve B-e has a lower frequency dependence than the prior art device.

As mentioned above, the SAW device of the present invention shown in FIG. 2 requires more strips than in the prior art device in order to obtain the same basic performance, with the exception of the stopband properties. The SAW device in accordance with the present invention, however, can obtain the predetermined stopbands of the predetermined frequencies through the formation of an electromechanical coupling element 30 which contains strips connected in a given manner and at a given distance from each other, depending on Expression 1.

The SAW device in accordance with the present invention can thus be used as high-performance filters, such as high performance bandpass filters having two stopbands as in television sets, selective rejection filters having predetermined frequencies, and other applications.

The SAW device shown in FIG. 2 is no more difficult to manufacture than devices according to the prior art, and entails about the same manufacturing costs and time.

The principle and scope of the present invention is not limited by the above-described example, which can be accompanied by several other modifications. Several more examples are described below.

Figure 10:
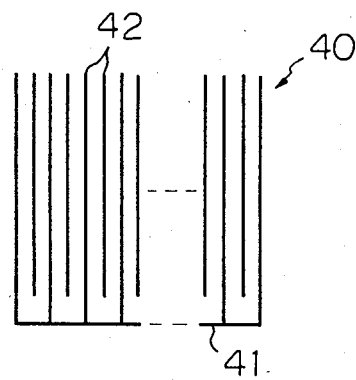
FIG. 10 is a plan view of another embodiment of the electromechanical coupling means of the SAW device in FIG. 2.

FIG. 10 is an alternate embodiment of the electromechanical coupling element 30 in FIG. 2 as an electromechanical coupling element 40. This coupling element 40 has a plurality of electrically conductive strips 42 arranged in parallel. Here, alternate strips are connected by a common connecting strip 41 at the strip ends near the second set of electrodes 18 (not shown). In this embodiment, the common connecting strip 41 is grounded; however, strip 41 may not be grounded, the effect obtained thereby being similar. Other features of the SAW device are the same as those mentioned above.

The SAW device provided with electromechanical coupling element 40 can be defined by the following relationship:

$$p' \approx (mV/4f_T) \qquad (2)$$

where,
p′: center-to-center distance between the strips;
m: number of stopbands, m=1, 2, - - -, m;
V: propagation speed of the surface acoustic wave; and
$f_T$: center frequency at the required stopband.

The SAW device provided with the electromechanical coupling means 40 (type: A-e) performs as shown in curve A-e in FIGS. 11 to 14. The measuring conditions are substantially the same as those for the SAW device in FIG. 2.

Figure 11:
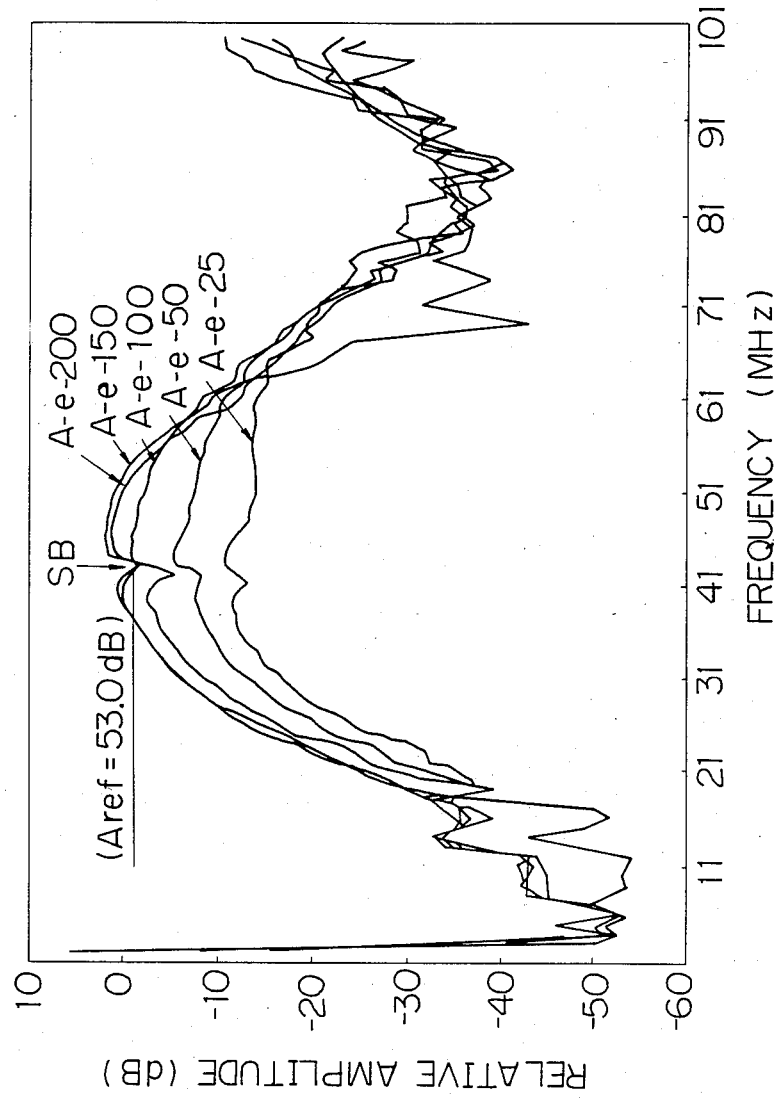
FIG. 11 is a graph of the total attenuation in accordance with the SAW device using the electromechanical coupling means.

Characteristic curves A-e in FIG. 11 correspond to those in FIG. 5, but have only one stopband SB.

Figure 12:
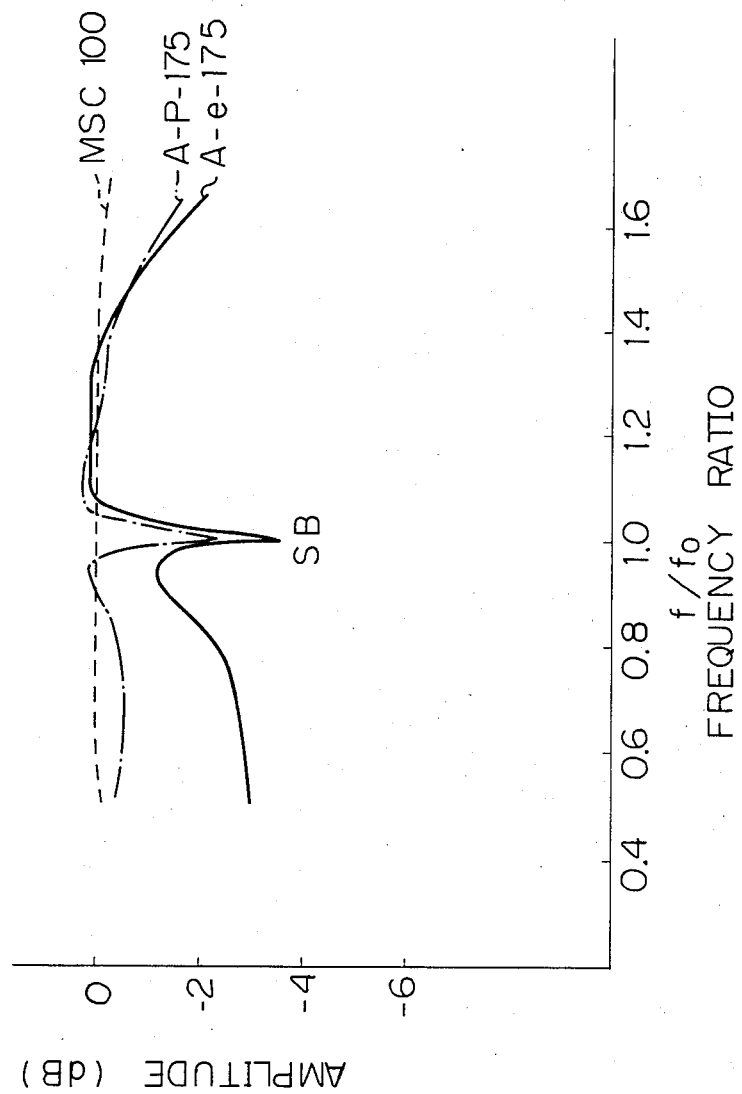
FIG. 12 is a graph of the characteristic curves corresponding to the curves in FIG. 6 for the electromechanical coupling means.

Stopband characteristic curve A-e 175 in FIG. 12 corresponds to that in FIG. 6.

Figure 13:
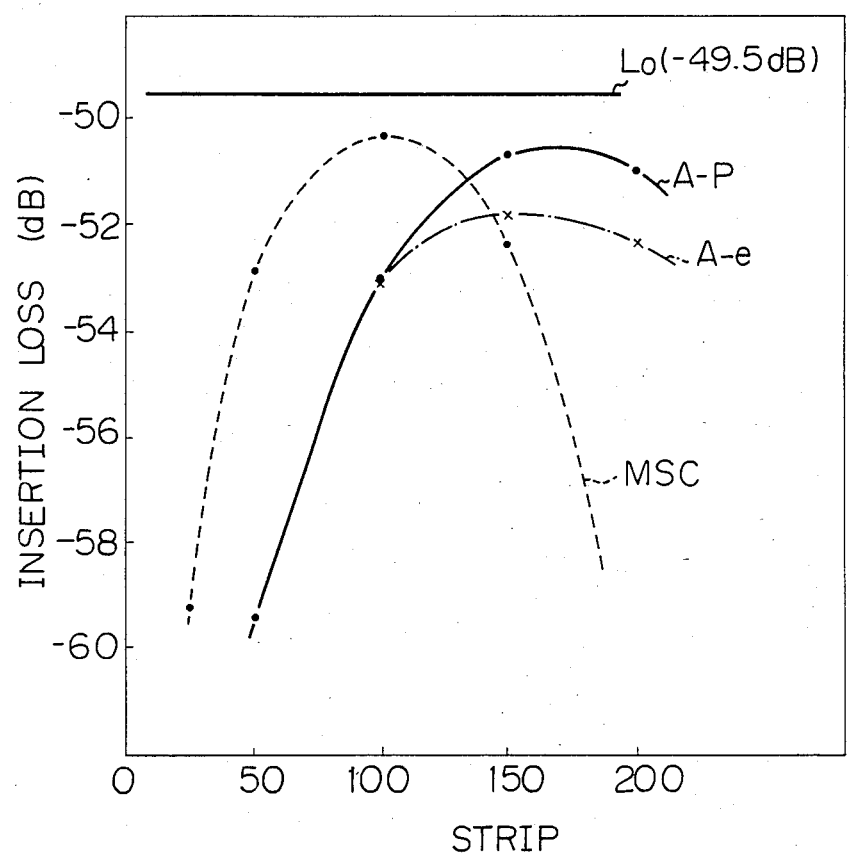
FIG. 13 is a graph of the characteristic curves corresponding to FIG. 8 for the SAW device using the electromechanical coupling means in FIG. 10.
Figure 14:
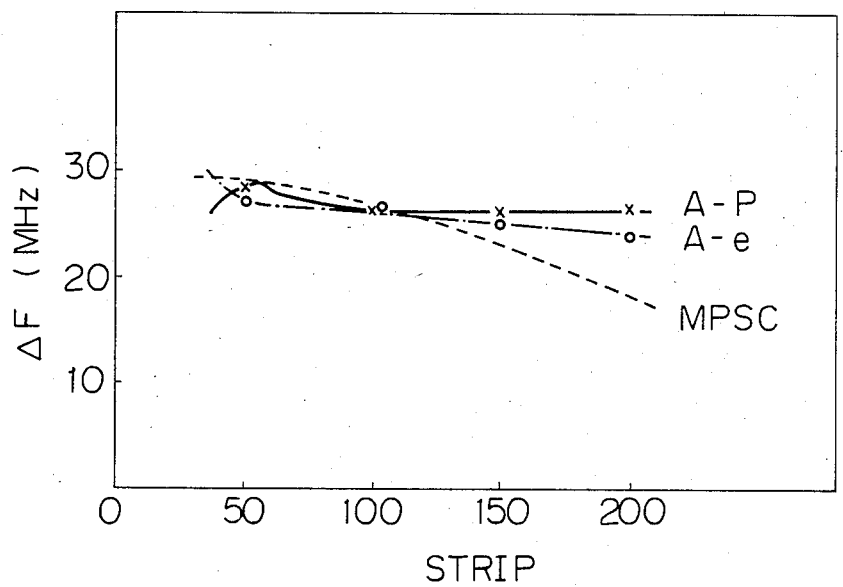
FIG. 14 is a graph of the characteristic curves corresponding to the curves in FIG. 9 for the SAW device used in the electromechanical coupling means shown in FIG. 10.

Curve A-e in FIG. 13 corresponds to that in FIG. 8.
Curve A-e in FIG. 14 corresponds to that in FIG. 9.

As is apparent from the above description and the performance curves in FIGS. 11 to 14, SAW devices provided with electromechanical coupling means 40 also have suitable stopbands in the same manner as the SAW device in FIG. 2, and maintain the basic performance characteristics of the prior art devices.

The preferred number of strips of the SAW device mentioned above range from approximately 100 to 200.

Figure 15:
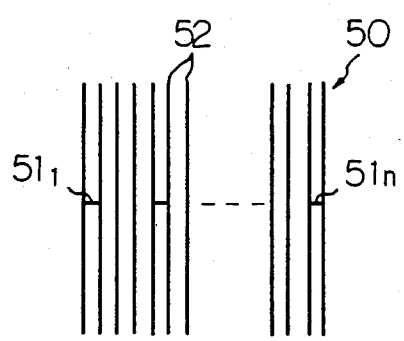
FIGS. 15 and 16 are plan views of other embodiments of the electromechanical coupling means of the SAW device shown in FIG. 2.
Figure 16:
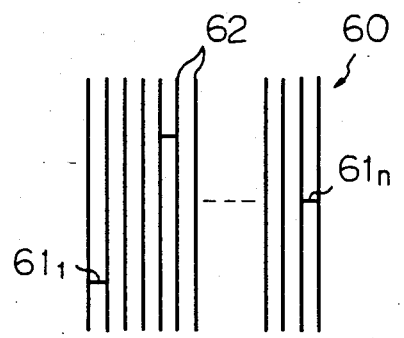

In addition, other embodiments in accordance with the present invention are shown in FIGS. 15 and 16. Electromechanical coupling elements 50 and 60 in FIGS. 15 and 16 are connected the same as the electromechanical coupling elements 30 shown in FIG. 7. However, connecting strips $51_1$ to $51_n$ and $61_1$ to $61_n$ are located at different longitudinal positions. Strips $51_1$ to $51_n$ are positioned at the middle of the strips 52 and the strips $61_1$ to $61_n$ are arranged arbitrarily.

Figure 17:
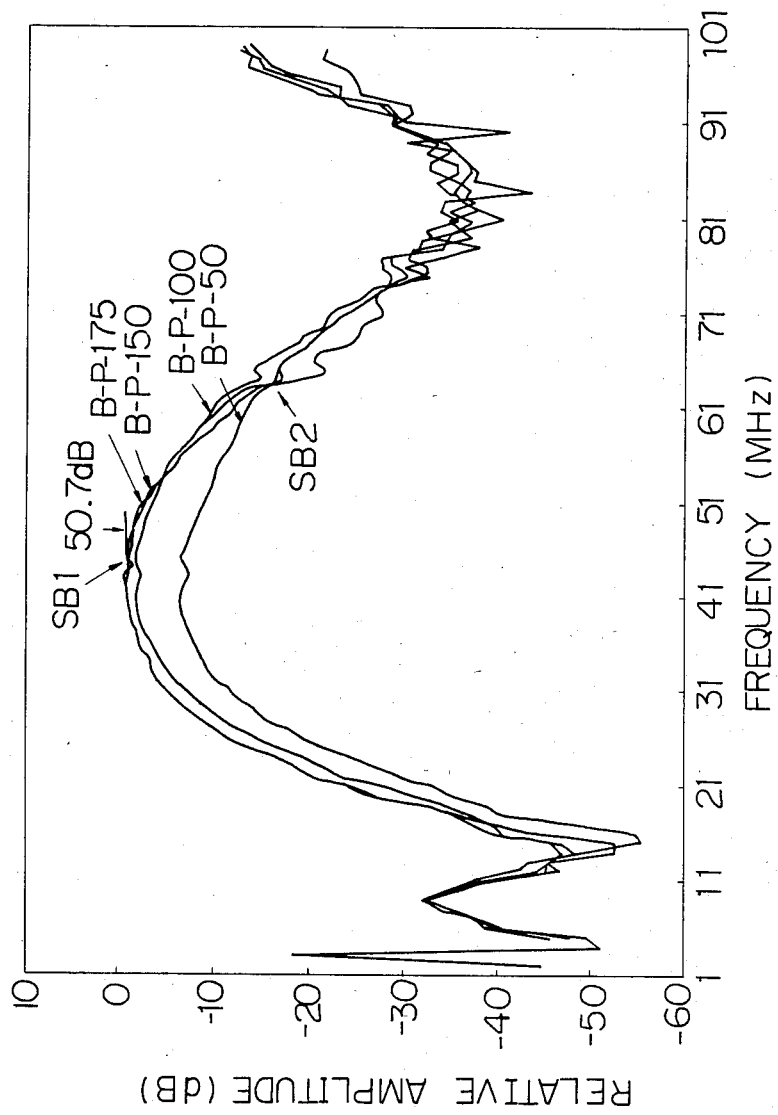
FIG. 17 is a graph of the attenuation characteristics of the SAW device using the electromechanical coupling means of FIGS. 15 and 16.

SAW devices containing an electromechanical coupling element 50 or 60 (type B-p) operate on substantially the same principle as does the device in FIG. 2 (B-e type). The measured performances of devices provided with electromechanical coupling means 50 or 60 are shown as curves B-p in FIG. 17 corresponding to FIG. 5, and curves B-p in FIGS. 8 and 9.

We claim:
1. A surface acoustic wave device comprising:
a piezoelectric substrate;
first electrode means, having a set of interdigital electrodes formed on the surface of said piezoelectric substrate, for generating surface acoustic waves on the surface region of the substrate when an electric signal is applied between two of said interdigital electrodes in said set of interdigital electrodes;
second electrode means having two interdigital electrodes formed on the surface of said piezoelectric substrate, the center of said second electrode means being spaced at a distance from the center of said first electrode means in the direction of propaga- tion of the surface acoustic waves which is oriented transverse to said interdigital electrodes, and generating an output electrical signal between said interdigital electrodes in response to the generated surface acoustic waves; and electromechanical coupling means, having a plurality of electrically conductive strips formed on said piezoelectric substrate between said first electrode means and said second electrode means and oriented substantially perpendicular to the direction of propagation of the surface acoustic waves, for receiving the generated surface acoustic waves and transmitting the generated surface acoustic waves to said second electrode means, said electrically conductive strips being arranged in parallel, along the direction of propagation of the surface acoustic waves, at a predetermined distance from each other, and in a repeating pattern including two consecutive electrically conductive strips connected at a predetermined position in the direction of propagation of the surface acoustic waves followed by two consecutive unconnected electrically conductive strips.

2. A surface acoustic wave device according to claim 1, wherein a center to center distance $p'$ between each of said electrically conductive strips of said electromechanical coupling means, is defined as follows:

$$p' = (\tfrac{1}{2}nV/4f_T)$$

where, n: number of stopbands (n = 1, 2, - - -, n);
V: propagation speed of the surface acoustic wave; and
$f_T$: center frequency of the stopband.

3. A surface acoustic wave device according to claim 1, wherein the number of said electrically conductive strips of said electromechanical coupling means is approximately between 100 and 200.

4. A surface acoustic wave device comprising:

a piezoelectric substrate;

first electrode means having a set of interdigital electrodes formed on the surface of said piezoelectric substrate, for generating surface acoustic waves on the surface region of said piezoelectric substrate when a high frequency AC voltage is applied between two of said interdigital electrodes in said set of interdigital electrodes;

second electrode means for receiving the generated surface acoustic waves from said first electrode means, said second electrode means having two interdigital electrodes formed on the surface of said piezoelectric substrate, the center of said second electrode means being spaced at a distance from the center of said first electrode means in the direction of propagation of the received surface acoustic waves which is oriented transverse to said interdigital electrodes, and said second electrode means generating an electrical signal between said interdigital electrodes in response to the received surface acoustic waves; and electromechanical coupling means, having a plurality of electrically conductive strips formed on said piezoelectric substrate between said first electrode means and said second electrode means and oriented substantially perpendicular to the direction of propagation of the surface acoustic waves, for receiving the generated surface acoustic waves and transmitting the generated surface acoustic waves to said second electrode means, said electrically conductive strips being arranged in parallel, along the direction of propagation at a given predetermined distance from each other, each of said electrically conductive strips having first and second ends, said first ends of said electrically conductive strips formed adjacent to said second electrode means and transverse to the direction of propagation of the surface acoustic waves, a predetermined number of said electrically conductive strips having said first ends arranged in a repeating pattern in the direction of propagation of the surface acoustic waves near said second electrode means, including two connected electrically conductive strips and followed by two unconnected consecutive electrically conductive strips.

5. A surface acoustic wave device according to claim 4, wherein a center-to-center distance $p'$ between each of said electrically conductive strips of said electromechanical coupling means, is defined as follows:

$$p' = (\tfrac{1}{2}nV/4f_T)$$

where, n: number of stopbands (n = 1, 2, - - -, n);
V: propagation speed of the surface acoustic wave; and
$f_T$: center frequency of the stopband.

6. A surface acoustic wave device according to claim 5, wherein said electrically conductive strips are spaced at a distance $p'$, where n = 1.

7. A surface acoustic wave device according to claim 5, wherein said electrically conductive strips are spaced at a distance $p'$, where n = 2.

* * * * *

UNITED STATES PATENT AND TRADEMARK OFFICE
CERTIFICATE OF CORRECTION

PATENT NO. : 4,551,695
DATED : NOVEMBER 5, 1985
INVENTOR(S) : SHIGEO TANJI ET AL.

It is certified that error appears in the above-identified patent and that said Letters Patent is hereby corrected as shown below:

Col. 6, line 43, "7" should be --2--;

line 49, "type" should be --type:--.

Signed and Sealed this

Twenty-fifth Day of March 1986

[SEAL]

Attest:

DONALD J. QUIGG

Attesting Officer  Commissioner of Patents and Trademarks